(12) United States Patent
Toshima et al.

(10) Patent No.: US 6,709,523 B1
(45) Date of Patent: Mar. 23, 2004

(54) SILYLATION TREATMENT UNIT AND METHOD

(75) Inventors: Takayuki Toshima, Nirasaki (JP); Tsutae Omori, Nirasaki (JP); Masami Yamashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 255 days.

(21) Appl. No.: 09/713,247

(22) Filed: Nov. 16, 2000

(30) Foreign Application Priority Data

Nov. 18, 1999 (JP) .......................................... 11-328269

(51) Int. Cl.$^7$ .............................................. C23C 16/00
(52) U.S. Cl. ...................... 118/725; 118/715; 118/724
(58) Field of Search ................................. 118/715, 724, 118/725, 726

(56) References Cited

U.S. PATENT DOCUMENTS

| | | | | | |
|---|---|---|---|---|---|
| 5,620,523 A | * | 4/1997 | Maeda et al. | .......... | 118/723 IR |
| 5,620,525 A | * | 4/1997 | van de Ven et al. | ......... | 118/728 |
| 5,843,233 A | * | 12/1998 | van de Ven et al. | ......... | 118/715 |
| 5,962,085 A | * | 10/1999 | Hayashi et al. | .............. | 427/585 |
| RE36,957 E | * | 11/2000 | Brors et al. | .................. | 118/725 |
| 6,143,078 A | * | 11/2000 | Ishikawa et al. | ............. | 118/715 |
| 6,151,446 A | * | 11/2000 | Hunter et al. | ................ | 392/416 |
| 6,232,236 B1 | * | 5/2001 | Shan et al. | .................. | 438/715 |
| 6,291,800 B1 | * | 9/2001 | Shirakawa et al. | .......... | 219/390 |
| 6,354,832 B1 | * | 3/2002 | Yoshimura et al. | .......... | 432/247 |
| 6,402,844 B1 | * | 6/2002 | Harada et al. | ............... | 118/666 |
| 6,402,849 B2 | * | 6/2002 | Kwag et al. | ................. | 118/715 |
| 6,409,838 B1 | * | 6/2002 | Sakai | ........................... | 118/725 |
| 2002/0043526 A1 | * | 4/2002 | Blanter | ........................ | 219/390 |

FOREIGN PATENT DOCUMENTS

| | | | |
|---|---|---|---|
| JP | 3-14223 | * | 1/1991 |
| JP | 11-274024 | | 10/1999 |

* cited by examiner

*Primary Examiner*—Jeffrie R. Lund
(74) *Attorney, Agent, or Firm*—Oblon, Spivak, McClelland, Maier & Neustadt, P.C.

(57) ABSTRACT

A silylation treatment unit includes a chamber, a heating mechanism provided in this chamber for heating a substrate, a supplying mechanism for supplying a vapor including a silylation reagent into the chamber. The unit also has a substrate holder for holding the substrate in the chamber, in which an interval between the heating mechanism and the substrate is adjustable to at least three levels or more. The substrate is received such that it is least influenced by a heat in the chamber by maximizing the interval from the heating mechanism. The interval is brought comparatively closer to the heating mechanism to wait until the temperature inside the chamber obtains a high planer uniformity. The interval is brought further closer to the heating mechanism after a high planer uniformity is obtained such that a silylation reaction occurs.

14 Claims, 14 Drawing Sheets

SILYLATION TREATMENT UNIT AND METHOD

CROSS-REFERENCE TO RELATED APPLICATIONS

This application is based upon and claims the benefit of priority from the prior Japanese Patent Application No. 11-328269, Nov. 18, 1999, the entire contents of which are incorporated herein by reference.

BACKGROUND OF THE INVENTION

The present invention relates to a silylation treatment unit and a silylation treatment method for performing a silylation treatment on a surface of a substrate, such as a semiconductor wafer or an LCD substrate.

In manufacturing a microelectronic device, such as a semiconductor integrated circuit, much higher performance is required for the lithography technology and the resist material being used, as the pattern being processed on the silicon wafer becomes finer.

With regard to the lithography technology being used for manufacturing the device, the wavelength of the light used for exposing the pattern is becoming shorter with both an i-ray source and a KrF excimer laser source being used.

The lithography is performed with the i-ray by using a photosensitizer of a novolac resist as a base resin. However, when using an excimer laser source to provide the shorter wavelength, the required fineness can not be achieved because the novolac resist has a high light absorption characteristic. Therefore, a resist using a phenolic ring compound has been suggested as a substitute. Although such a phenolic resist has an advantage in increased plasma resistance, the phenolic resist has an extremely high light absorptance, especially as the wavelength becomes shorter. Thus, light of short wavelength does not reach deep enough when an excimer laser light source is used.

A silylation method is a method having enough sensitivity and an improved plasma resistance, even when the light source used has a short wavelength, such as that of the excimer laser light source. with this silylation method, a resist pattern having enough selectivity can be formed by exposing the photosensitizer to a predetermined pattern image, performing a silylation on the surface of thus-exposed photosensitizer, and performing dry developing using the silylation treated photosensitizer as a mask.

There is a problem, however, that the silylation reaction of the silylation method has an extremely high temperature dependency, such that the silylation reaction progresses ununiformly within the surface of a wafer if the temperature within the surface of the wafer is ununiform. Therefore, it is necessary to insure the uniformity of the silylation layer in order to employ the silylation method. To solve this problem, various conventional measures have been taken relative to hardware structures, such as the structure of the treatment chamber, the supplying method for the silylation atmosphere, and using a precision hot plate. However, even though the uniformity of the silylation layer can be improved by these measures, a minute defect in the hardware structure can prevent the uniform formation of the silylation layer, since its processing condition depends on the hardware.

BRIEF SUMMARY OF THE INVENTION

The present invention solves the aforementioned problem and its object is to provide a silylation unit and a silylation treatment method which are capable of obtaining a uniform silylation layer without depending on the hardware structure.

According to a first aspect of the present invention, there is provided a silylation unit comprising a chamber, a heating mechanism provided in the chamber for heating a substrate, a supplying mechanism for supplying a vapor including a silylation reagent into the chamber, and a substrate holder for holding the substrate in the chamber, in which an interval between the heating mechanism and the substrate is adjustable to at least three fixed levels or more.

When structured as above, it is possible to receive the substrate in a condition where it is least influenced by the heat in the chamber by maximizing the spacing from the heating mechanism, to them bring the substrate comparatively closer to the heating mechanism to wait there until the temperature inside the chamber obtains a high planer uniformity, and to then bring it closer to the heating mechanism only after the high planer uniformity of temperature is obtained such that the silylation reaction occurs. Thus, by holding the substrate at a predetermined spacing from the heating mechanism until the heating by the heating mechanism becomes uniform, silylation under the ununiform silylation atmosphere does not occur. Therefore, the uniform silylation layer can be obtained without depending on the hardware structure.

According to a second aspect of the present invention, there is provided a silylation treatment method comprising the steps of bringing the substrate into the chamber and disposing it at a predetermined spacing from the heating mechanism provided in the chamber, supplying vapor including the silylation reagent into the chamber such that the chamber is filled with an atmosphere containing the silylation reagent, raising the temperature of the chamber using the heating mechanism, then bringing the substrate closer to the heating mechanism such that the silylation atmosphere is dispersed uniformly inside the chamber at a temperature where the silylation reaction of the substrate does not occur, and further then bringing the substrate even closer to the heating mechanism to raise the temperature of the substrate such that the silylation reaction occurs on the surface of the substrate.

According to this method, it is preferable that the spacing between the heating mechanism and the substrate is adjustable to at least three or more maintainable levels. Also, it is preferable that the substrate almost contacts the heating mechanism during the silylation reaction.

Further, the silylation treatment can be completed simply by supplying an inert gas into the chamber for replacing the vapor including the silylation reagent. Further, an excessive silylation reaction can be prevented by spacing the heating mechanism further from the substrate before replacing the gas inside the chamber.

Moreover, when the silylation atmosphere is being introduced under the condition that the heating mechanism and the substrate are disposed at a predetermined spacing, the volume of the gas decreases inside the chamber by reducing the pressure inside the chamber so that the gas flow inside the chamber is stabilized and the uniformity of the density of the silylation reagent is further increased.

Furthermore, by causing the silylation reaction to occur while stopping the supply of the silylation reagent into the chamber without any gas being exhausted from the chamber, this stops the gas flow inside the chamber and the silylation reaction is made to occur while maintaining the uniform silylation atmosphere so that a planer uniformity of the silylation reaction on the wafer further increases.

Additional objects and advantages of the invention will be set forth in the description which follows, and in part will be obvious from the description, or may be learned by practicing the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, preferred embodiments according to the present invention will be explained with reference to the attached drawings.

(First Embodiment)

In this embodiment, a silylation treatment unit of the present invention which is applied to a resist treatment system for a semiconductor wafer will be explained.

Figure 1:
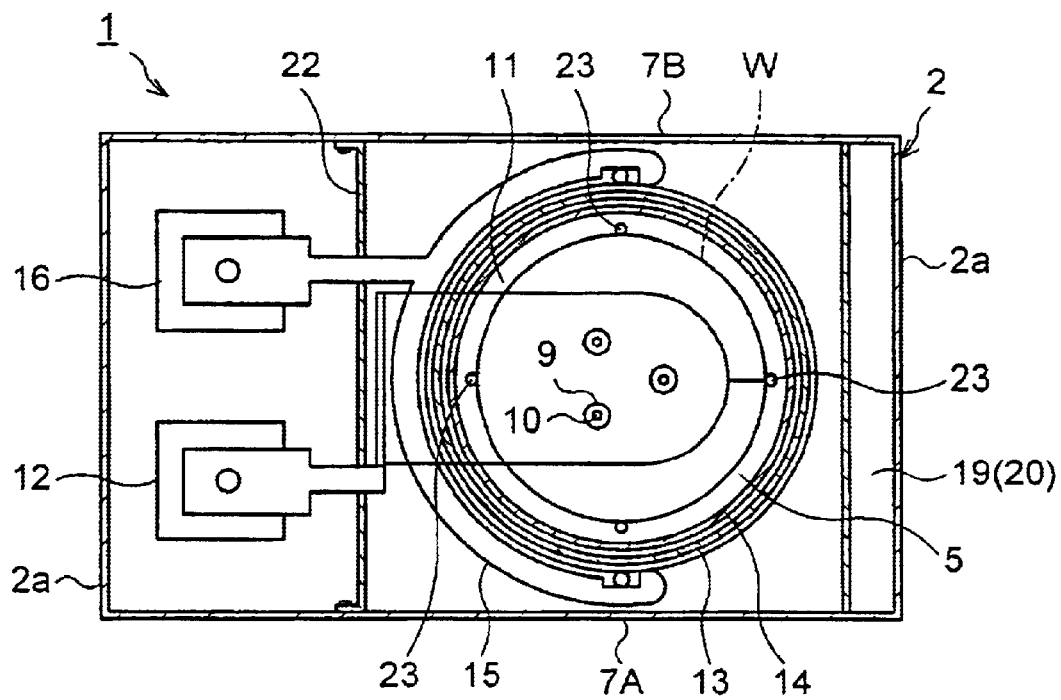
FIG. 1 is a top view showing the whole structure of a silylation treatment unit according to a first embodiment of the present invention.
Figure 2:
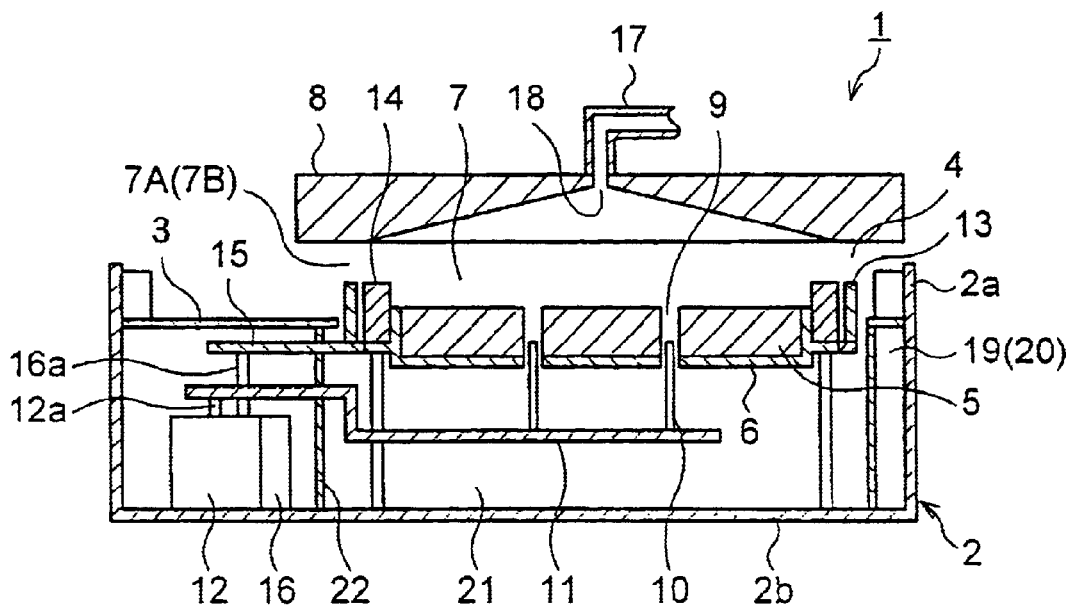
FIG. 2 is a vertical sectional view showing the whole structure of the silylation treatment unit according to the first embodiment.

FIGS. 1 and 2 are a plane view and a vertical sectional view showing the structure of the silylation treatment unit, respectively.

As shown in FIG. 1, a silylation treatment unit 1 includes a base block 2. The base block 2 is hollow and comprises a base block side portion 2a which defines its side and a base block bottom portion 2b which defines its bottom. Further, a horizontal masking shield 3 is attached horizontally to the base block bottom portion 2b at a position of a predetermined height of the base block side portion 2a. A circular opening 4 is formed in the horizontal masking shield 3 and a hot plate 5 is received as a heating mechanism in this opening 4. The horizontal masking shield 3 supports the hot plate 5 by a supporting plate 6.

A treatment chamber 7 for performing a silylation treatment is defined by the base block side portion 2a, the horizontal masking shield 3 and a cover 8. Openings 7A and 7B are respectively formed in the front side and the back side of the treatment chamber 7 and a wafer W is carried into/out of the treatment chamber 7 through the openings 7A and 7B.

Three holes 9 are penetratingly formed in the hot plate 5 and lifter pins 10 are respectively inserted through each of the holes 9 as wafer W holders. Three lifter pins 10 are connected and supported by an arm 11, and the arm 11 is supported by, for example, a rod 12a of a vertical cylinder 12. When the rod 12a is projected from the vertical cylinder 12, the lifter pins 10 are projected so as to lift the wafer W from the hot plate 5.

The height of the lifter pins 10 which support the wafer W at three points is adjustable to three wafer holding levels such as low, medium and high (hereinafter each height is referred to as the low level, the medium level and the high level). At the low level, the lifter pins 10 do not project from the surface of the hot plate 5. Therefore, the spacing between the wafer W which is held by the lifter pins 10 and the surface of the hot plate 5 is theoretically 0 mm, but the spacing in the actual structure of the unit is, for example, about 0.1 mm. At the medium level, the lifter pins 10 project from the surface of the hot plate 5, for example, by 7 mm. Further, at the high level, the lifter pins 10 project from the surface of the hot plate 5, for example, by 18 mm. The wafer W is transferred by a carrier mechanism which is not illustrated from another treatment mechanism at this high level.

As shown in FIG. 2, a ring-shaped shutter 13 is attached at the outer circumference of the hot plate 5. The shutter 13 is supported by a rod 16a of a vertical cylinder 16 through an arm 15 so that it is able to ascend and descend. This shutter 13 is retreated to a low level when the treatment is not performed, but rises when the treatment is performed to position itself between the hot plate 5 and the cover 8. At the inner circumference of the shutter 13, a ring-shaped supply ring 14 is disposed in such a manner to surround the hot plate 5.

Figure 3:
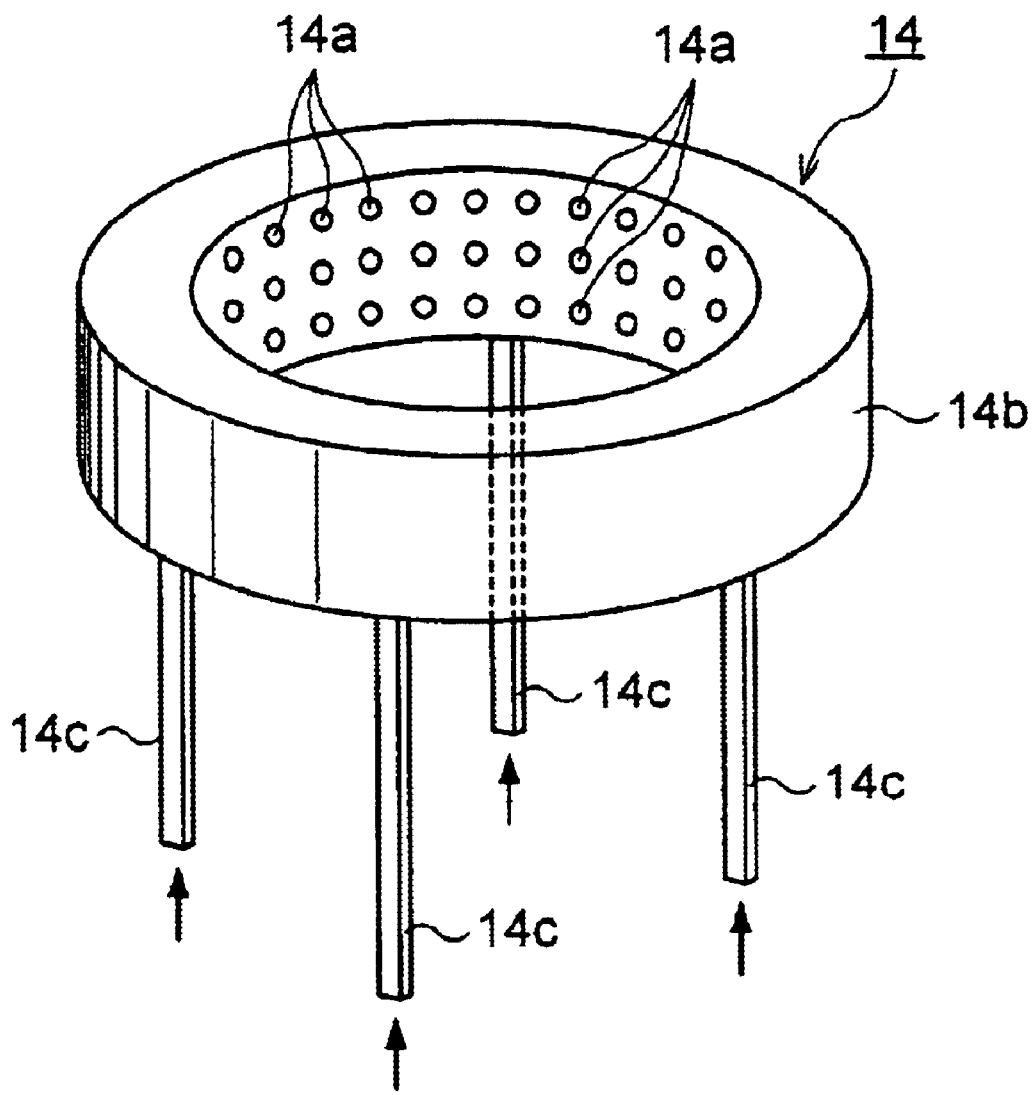
FIG. 3 is a perspective view of a supply ring according to the first embodiment.

FIG. 3 shows the perspective structure of the supply ring 14 in detail. As shown in FIG. 3, the supply ring 14 includes an annular ring member 14b. Many supply holes 14a are formed along the inner circumference of the ring of the ring member 14*b* at pitch intervals of, for example, the central angle of 2°. Four supply paths 14*c* are opened at the bottom surface of the ring of this ring member 14*b* and at the symmetrical positions with respect to the center of the ring of the ring member 14*b*. These supply paths 14*c* communicate with a silylation reagent supply source (not illustrated) outside the base block 2 through the openings provided at the base block bottom portion 2*b*.

In the center of the cover 8, an open exhaust port 18 that communicates with an exhaust pipe 17 is provided. The gas generated in the heating treatment or the like is exhausted through this exhaust port 18. The exhaust pipe 17 communicates with a duct 19 (or 20) at the front side of the unit or another duct not illustrated.

A machine room 21 is provided under the horizontal masking shield 3. The machine room 21 defines its periphery by the sidewall of the duct 19, a sidewall 22 and the base block bottom portion 2*b*. Inside the machine room 21, for example, the hot plate supporting plate 6, the shutter arm 15, a lifter pin arm 11, an elevating cylinder 16, and the elevating cylinder 12 are provided.

As shown in FIG. 1, four protrusions 23, for example, are provided on the upper surface of the hot plate 5 and the wafer W is positioned by these four protrusions. Further, a plurality of small protrusions (not illustrated) are provided on the upper surface of the hot plate 5, where the tops of these small protrusions contact with the wafer W when the wafer W is mounted on the hot plate 5. Thus, a minute space (about 0.1 mm) is formed between the wafer W and the hot plate 5 so that the bottom surface of the wafer W is free from dust and scratch.

Next, a control system and a silylation reagent vapor supplying mechanism of the silylation treatment unit are explained with reference to FIG. 4.

Figure 4:
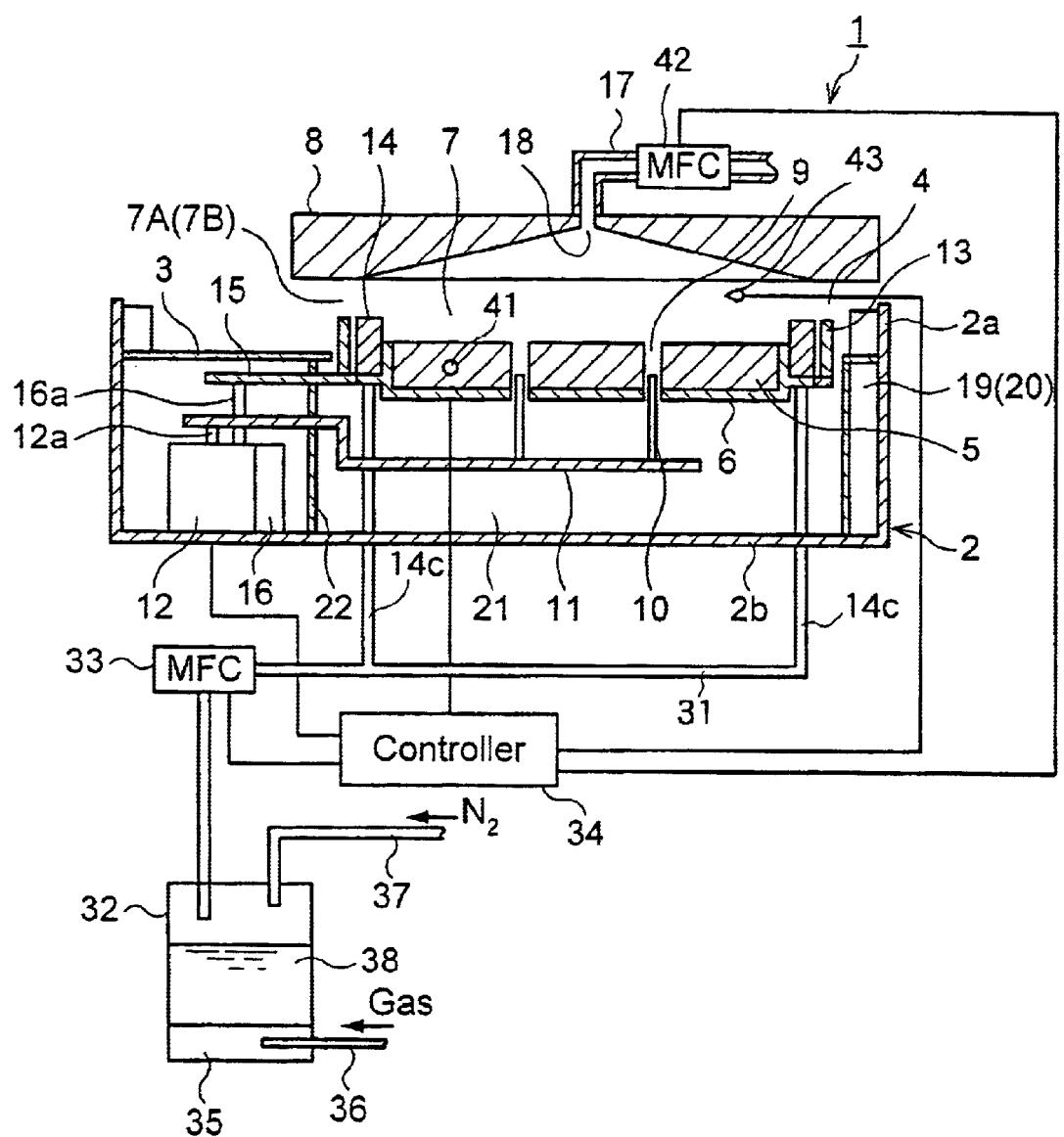
FIG. 4 is a view showing the whole structure of the silylation treatment unit according to the first embodiment, together with a control system.

As shown in FIG. 4, each of the supply paths 14*c* communicates with a silylation reagent vapor supply pipe 31 and this silylation reagent vapor supply pipe 31 supplies the silylation reagent vapor which is generated in a bubbler tank 32 into the treatment chamber 7. A mass flow controller 33 is provided to the silylation reagent vapor supply pipe 31, which controls the volume of the flow of the silylation reagent vapor supplied into the treatment chamber 7 based on the control command from a controller 34.

A bubbling member 35 made of, for example, porous ceramic or the like is provided at the bottom surface of the bubbler tank 32, and a gas supply pipe 36 which supplies an inert gas such as $N_2$ is inserted through the bubbling member 35. From the upper surface of the bubbler tank 32, a carrier gas, for example, $N_2$ is supplied from a carrier gas supply pipe 37, the silylation reagent vapor is generated while supplying the inert gas from the gas supply pipe 36 into the bubbling member 35 to perform the bubbling of a silylation reagent 38 stored in the tank 32, and the silylation reagent vapor is supplied into the treatment chamber 7 from the gas supply pipe 31 by using $N_2$ as a carrier gas.

The hot plate 5 has an electrical resistance heater (not illustrated) and a temperature sensor 41 which are built-in and outputs the sensed temperature of the hot plate 5 to the controller 34. The controller 34 controls the temperature of the hot plate 5 by using the electrical resistance heater based on the sensed temperature of the hot plate 5. Incidentally, the hot plate may be, for example, a jacket having a hollow portion, to thereby heat the wafer W by supplying a circulating heating medium to the hollow portion.

A mass flow controller 42, for example, is provided to the exhaust pipe 17 and the controller 34 controls the exhaust flow.

A pressure sensor 43, for example, is attached inside the treatment chamber 7 and the pressure sensed inside the treatment chamber 7 by this pressure sensor 43 is outputted to the controller 34. The controller 34 controls the mass flow controllers 33 and 42 based on the sensed pressure inside the treatment chamber 7. Thus, the flow of the silylation reagent vapor supplied into the treatment chamber 7 and the exhaust gas exhausted from the treatment chamber 7 are controlled.

Note that the bubbler tank 32 is not limited to the aforementioned structure, but may perform the bubbling, for example, by forming many holes in the supply pipe 36 and supplying the gas through these holes, without using the bubbling member 35 for performing the bubbling. It is preferable to provide a check-valve to the supply pipe 36 in order to prevent backflow of the silylation reagent 38 while the gas is not supplied.

Figure 5:
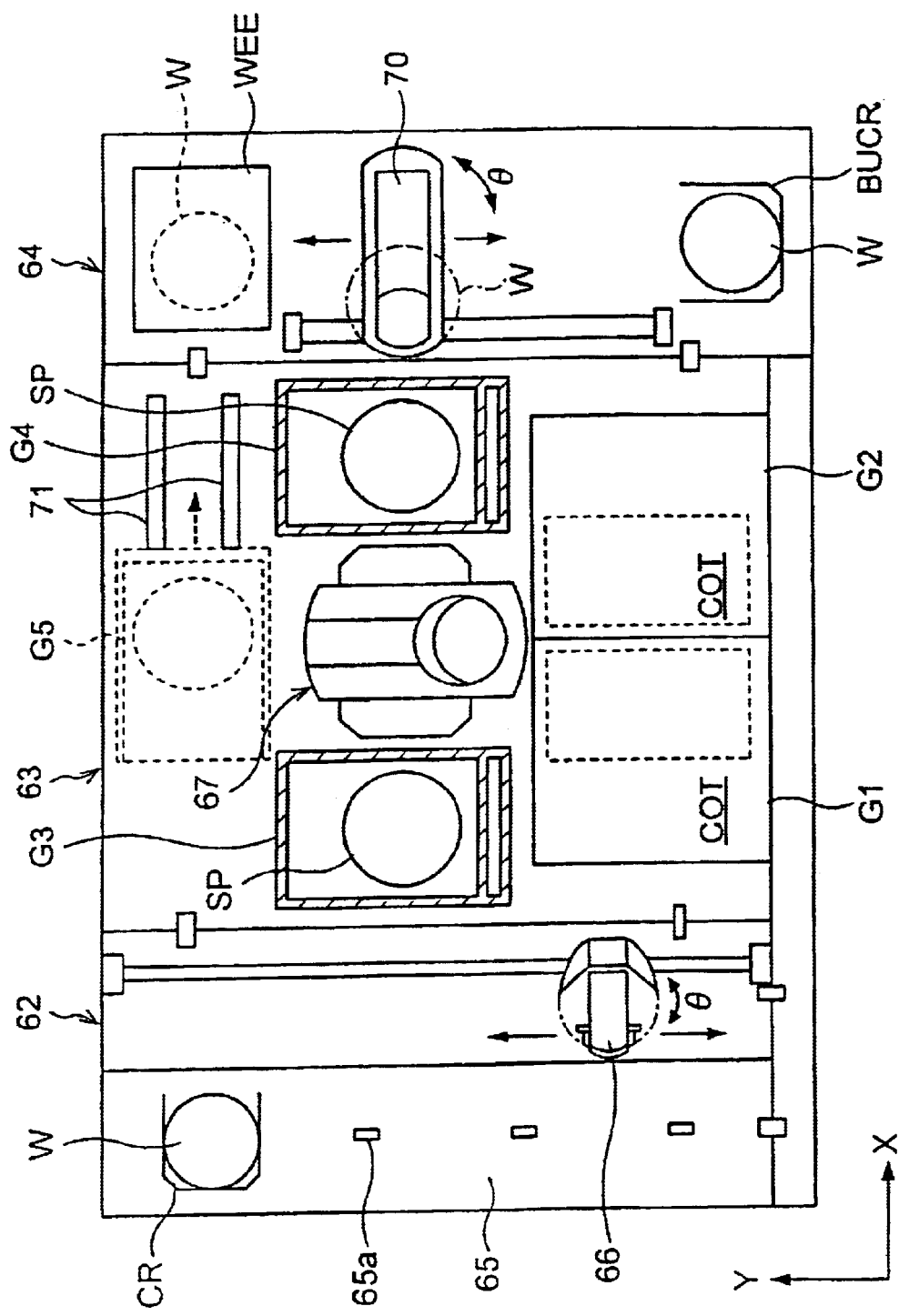
FIG. 5 is a view of the whole structure of a resist treatment system having the silylation treatment unit according to the first embodiment.
Figure 6:
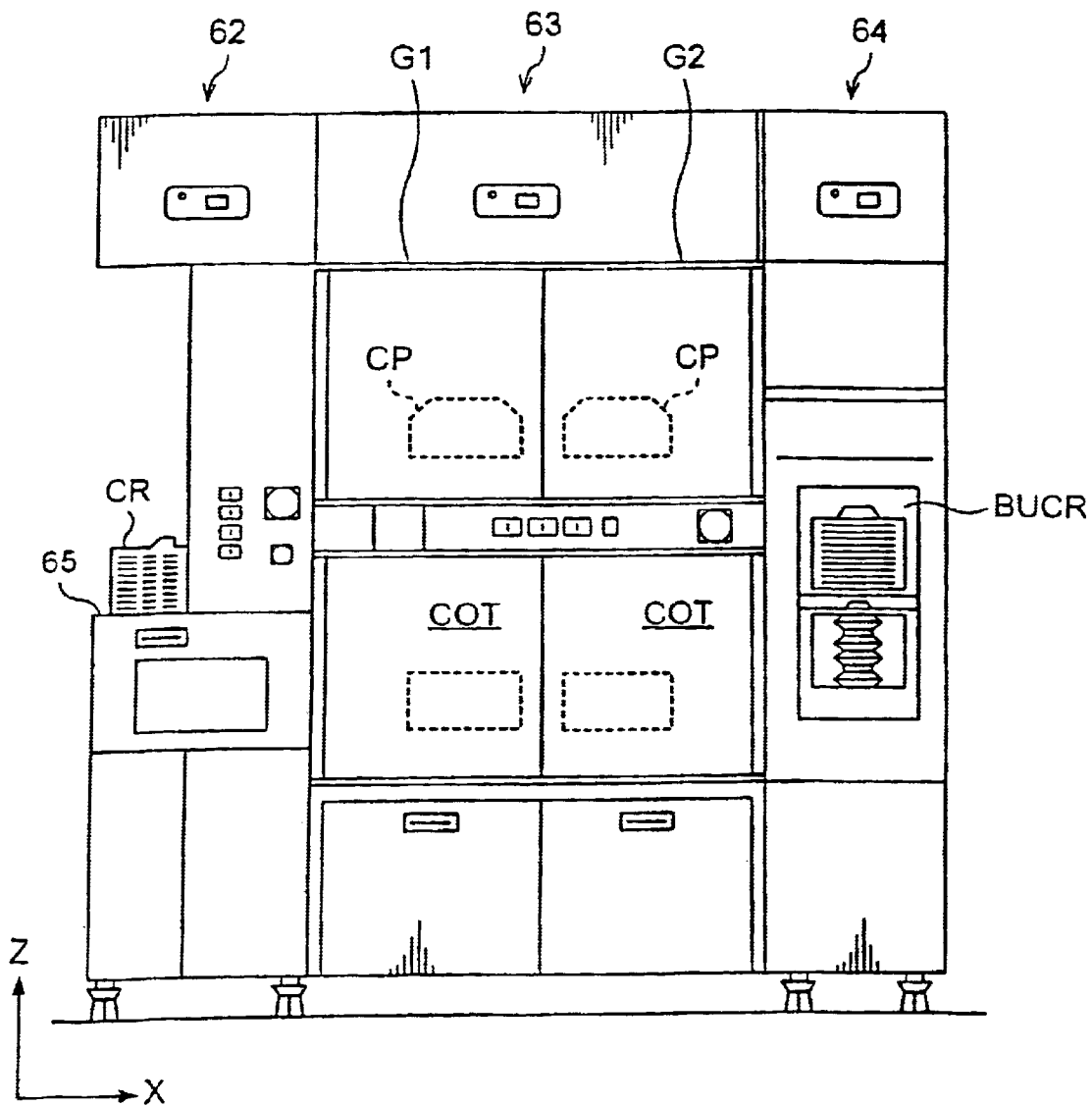
FIG. 6 is a side view of the resist treatment system having the silylation treatment unit according to the first embodiment.
Figure 7:
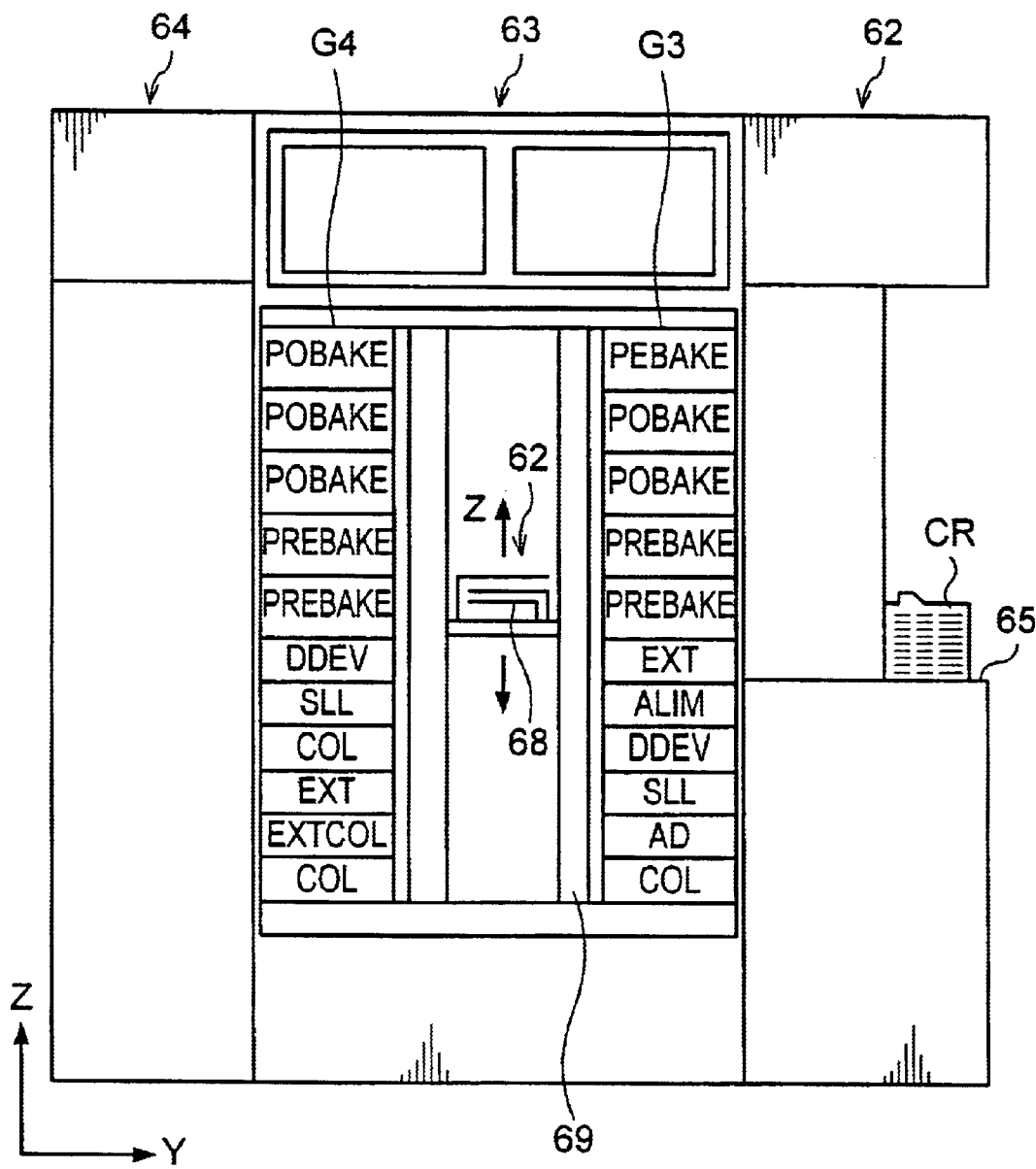
FIG. 7 is a front view for explaining the functions of the resist treatment system having the silylation treatment unit according to the first embodiment.

The silylation treatment unit is applied to a coating and developing system shown in FIG. 5 to FIG. 7.

As shown in FIG. 5, the coating and developing system includes a load/unload section 62 which takes wafers W subsequently out of a cassette CR storing the wafers W, a processing section 63 which performs the processing of coating a resist solution to the wafers and an interface section 64 which transfers the wafer W coated with the resist solution to an exposure unit not illustrated. The load/unload section 62 includes a mounting table 65 which takes in/out the wafer from the cassette CR storing, for example, 25 semiconductor wafers W.

In the load/unload section 62, as shown in FIG. 5, a plurality of, for example, up to 4 cassettes CR are mounted in a line at a positioning projection 65*a* on the mounting table 65, in the Y direction each directing its access ports of the wafer toward the processing section 63. A first sub-arm mechanism 66 which is movable in the cassette alignment direction (Y direction) and in a wafer alignment direction of the wafers W stored in the cassette CR (Z direction; a vertical direction) provides access to each of the cassettes CR selectively.

Further, the first sub-arm mechanism 66 is structured rotatively in a θ direction and is able to transfer the wafer W to a main arm mechanism 67 which is provided in the processing section 63. Further, as described later, it can give access to an alignment unit (ALIM) and an extension unit (EXT) which belong to a multi-tiered unit section of a third processing unit group G3 of the processing section 63 side.

The transfer of the wafer W between the load/unload section 62 and the processing section 63 is performed through the third processing unit group G3. This third processing unit group G3 is structured by vertically piling up a plurality of processing units as shown in FIG. 7. More specifically, the processing unit group G3 is structured by sequentially piling a cooling unit (COL) which performs the cooling treatment to the wafer W, an adhesion unit (AD) which performs the hydrophobic treatment for increasing the adhesion property of the resist solution to the wafer W, a silylation treatment unit (SLL) which performs the silylation treatment to the wafer W, a dry developing unit (DDEV) which performs the dry developing to the silylation treated wafer W, the alignment unit (ALIM) which performs alignment of the wafer W, the extension unit (EXT) which makes the wafer W wait, two prebaking units (PREBAKE), each of which performs the heating treatment before an exposure processing, two postbaking units (POBAKE), each of which performs the heating treatment after the exposure processing, and a post-exposure baking unit (PEBAKE), from bottom to top.

The transfer of the wafer W to the main arm mechanism 67 is performed through the extension unit (EXT) and the alignment unit (ALIM).

As shown in FIG. 5, first to fifth processing unit groups G1 to G5 including the above-noted third processing unit group G3 are provided around the main arm mechanism 67 in such a manner to surround the main arm mechanism 67. Similarly to the third processing unit group G3, other processing unit groups G1, G2, G4 and G5 are structured by vertically piling up the various processing units. The silylation treatment unit (SLL) of the present invention is provided to the third and fourth processing unit groups G3 and G4.

Meanwhile, as shown in FIG. 7, the main arm mechanism 67 is equipped with a main arm 68 which can ascend and descend freely in a vertical direction (Z direction) inside a cylindrical guide 69 connected extendedly in a vertical direction. The cylinder-shaped guide 69 is connected to a rotation shaft of a motor (not illustrated) and rotates integrally with the main arm 68 around the rotation shaft by the rotation power of the motor, whereby the main arm 68 is made to rotate in a θ direction. The cylinder-shaped guide 69 may be structured in such a manner to connect to another rotation shaft (not illustrated) which is rotated by the above motor. As described above, the main arm 68 is driven vertically so that the wafer W is able to arbitrarily give access to each processing unit of each of the processing unit groups G1 to G5.

The main arm mechanism 67 which receives the wafer W through the extension unit (EXT) of the third processing unit group G3 from the load/unload section 62, first carries this wafer W into the adhesion unit (AD) of the third processing unit group G3 to perform a hydrophobic treatment. Next, the wafer W is carried out from the adhesion unit (AD) and subjected to the cooling treatment in the cooling unit (COL).

The wafer W after the cooling treatment is positioned opposed to a resist solution coating unit (COT) of the first processing unit group G1 (or the second processing unit group G2) by the main arm mechanism 67 and carried thereinto.

The wafer W coated with the resist solution is unloaded by the main arm mechanism 67 and transferred to the interface section 64 through the fourth processing unit group G4.

As shown in FIG. 7, this fourth processing unit group G4 is structured by sequentially piling the cooling unit (COL), an extension-cooling unit (EXT-COL), the extension unit (EXT), the cooling unit (COL), the silylation treatment unit (SLL), the dry developing unit (DDEV), two prebaking units (PREBAKE), and three postbaking units (POBAKE) from bottom to top.

The wafer W carried out from the resist solution coating unit (COT) is first inserted into the prebaking unit (PREBAKE) for removing a solvent (thinner) from the resist solution and drying. This drying can be performed, for example, by means of a reduced pressure method. That is, it may be a method in which the wafer W is inserted into the prebaking unit (PREBAKE) or a chamber separately provided therefrom so that the solvent is removed (the resist solution is dried) by reducing the pressure around the wafer W.

Next, the wafer W is transferred to a second sub-arm mechanism 70 which is provided in the interface section 64 through the extension unit (EXT) after this wafer W is cooled in the cooling unit (COL).

The second sub-arm mechanism 70 which has received the wafer W transfers the received wafer W into a buffer cassette BUCR sequentially. The interface section 64 transfers this wafer W to the exposure unit not illustrated and receives the exposure processed wafer W.

The wafer W after the exposure processing is transferred to the main arm mechanism 67 through the fourth processing unit group G4 in the reverse order to the above after an unnecessary resist film in the peripheral portion of the wafer is removed by a peripheral exposure unit (WEE), in which this main arm mechanism 67 carries the exposure processed wafer W into the silylation treatment unit (SLL). The wafer W which has been subjected to the silylation treatment in the silylation treatment unit (SLL) is carried into the dry developing unit (DDEV) to be subjected to dry developing. Subsequently, it is transferred out to the load/unload section 62 through the extension unit (EXT).

Note that the fifth processing unit group G5 is selectively provided and it is structured similarly to the fourth processing unit group G4 in this embodiment. Further, the fifth processing unit group G5 is movably held by a rail 71 so that the maintenance processing of the main arm mechanism 67 and the first to fourth processing unit groups G1 to G4 can be easily performed.

When the silylation treatment unit of the present invention is applied to a coating and developing unit as shown in FIG. 5 to FIG. 7, it can remarkably decrease the area for installation of the unit because each processing unit is piled on another vertically.

The silylation treatment unit shown in this embodiment can be applied to units other than the coating and developing unit shown. Further, various changes may be made therein without departing from the spirit of the present invention.

Figure 8A:
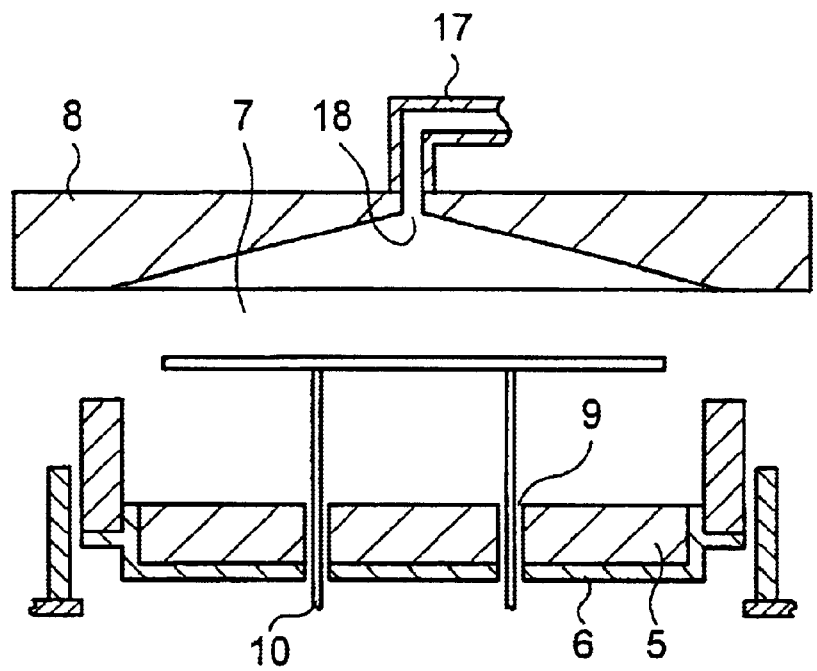
FIGS. 8A, 8B, and 8C are views showing a process of the silylation treatment according to the first embodiment.

Next, the silylation treatment process by the coating and developing system is explained with reference to process sectional views of FIGS. 8A to 8C and the flow chart of FIG. 9.

When a main switch of the coating and developing system is turned on, electric power supply begins respectively from each power source to the silylation treatment unit 1.

Then, the shutter 13 is opened and the wafer W is mounted on an arm holder (not illustrated) for holding the main arm of the main arm mechanism 67, which is inserted into the treatment chamber 7. When carrying in the wafer W, the lifter pins 10 are raised from the hot plate 5 by about 18 mm (S1), the wafer W is transferred from the arm holder to the lifter pins 10, and the arm holder is retreated from the treatment chamber 7 (FIG. 8A, S2). Since the temperature inside the treatment chamber 7 when carrying in the wafer W is room temperature, it is certain that a silylation reaction on the surface of the wafer W can not occur at this stage.

After the wafer W is carried into the position spaced from the hot plate 5 by about 18 mm, the shutter 13 is raised to seal up the treatment chamber 7 and the atmosphere is exhausted from the exhaust port 17 to reduce the pressure inside the treatment chamber 7 (S3). Further, when the pressure is reduced to a predetermined value, for example, 80 pascals, and the silylation reagent vapor is supplied from the supply holes 14a (S4). Here, the temperature of the silylation reagent vapor is preferably made nearly the same as that of the wafer W, for example, about 40° C. to about 50° C. in order to avoid any reaction from unintentionally progressing.

Figure 8B:
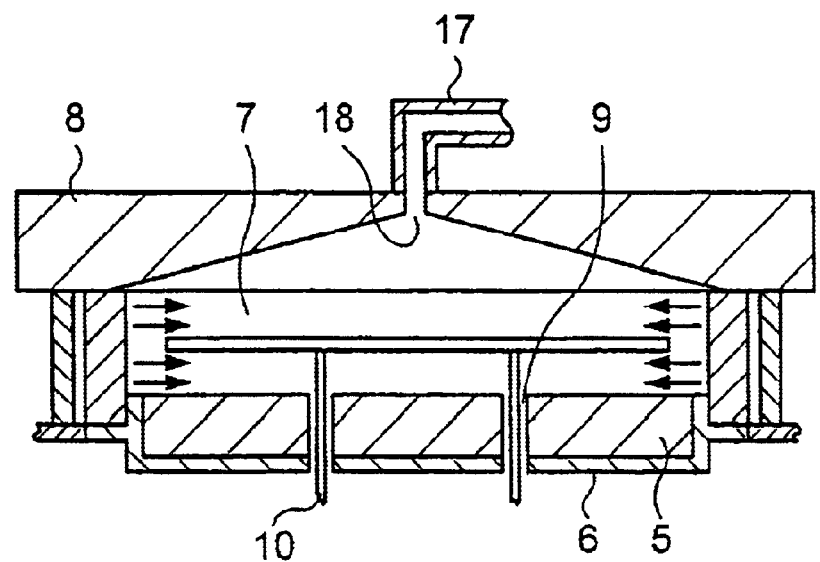

Then, when the treatment chamber 7 is filled with the silylation reagent vapor, the hot plate 5 is heated (S5). Further, the lifter pin 10 is lowered to set the spacing between the wafer W and the hot plate 5 to be about 7 mm (S6). Incidentally, the hot plate 5 may of course be heated after the lifter pin 10 is lowered. The wafer W is spaced from the hot plate 5 so that the temperature of the wafer W is kept lower than that of the surface of the hot plate 5. Specifically, the temperature of the wafer W is held to about 40–50° C.

in order to keep the temperature of the surface of the wafer W at a level not to cause the silylation reaction to occur (FIG. 8B). Under this temperature condition, it is necessary to wait until the silylation reagent vapor is uniformly dispersed inside the treatment chamber 7 (S7). When the silylation reagent vapor is uniformly dispersed, the temperature of the wafer W becomes uniform in its surface.

Moreover, the hot plate 5 is kept heating when the treatment chamber 7 is sealed up to maintain a constant pressure while the supply of the silylation reagent vapor is stopped and the exhaust of the gas from the exhaust pipe 17 is stopped so that all the gas flow inside the treatment chamber 7 is stopped, and the temperature inside the treatment chamber 7 is made uniform in the surface of the wafer W (S8).

Figure 8C:
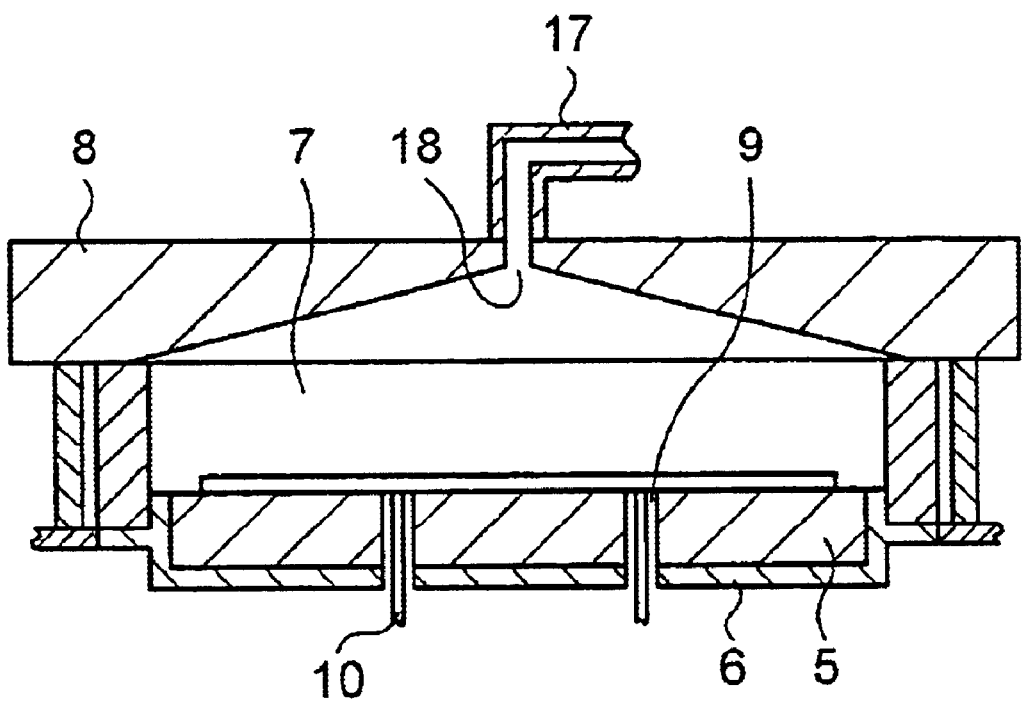

Furthermore, when the temperature of the hot plate 5 itself becomes, for example, about 80–90° C., the lifter pins 10 are further lowered so that the spacing between the wafer W and the hot plate 5 is set to be about 0.1 mm (FIG. 8C, S9). Here, as the wafer W is heated to about 80–90° C., the temperature of the wafer W also rises to 80–90° C. and the silylation progresses on the surface thereof (S10). The silylation reaction progresses uniformly on the surface of the wafer W because the supply of the gas into the treatment chamber 7 and the exhaust of the gas from the treatment chamber 7 are already stopped to obtain sealing, and the planer uniformity of the temperature inside the treatment chamber 7 is maintained during silylation.

When silylation is completed, $N_2$ gas is supplied into the treatment chamber 7 from the gas supply port, which is not illustrated, while the gas, including the silylation reagent vapor, is exhausted from the exhaust port 17 so that the gas inside the treatment chamber 7, which includes the silylation reagent vapor, is replaced by the $N_2$ gas in order to end the silylation reaction (S11). The silylation reaction finishes upon replacing the gas inside the treatment chamber 7. Incidentally, until the temperature of the surface of the wafer W lowers to about 50° C. while replacing the gas, it is necessary to maintain the uniform temperature on the surface of the wafer W because the silylation reaction progresses, although slowly. Thus, it is preferable to have a larger spacing between the wafer W and the hot plate 5 than 7 mm by raising the lifter pins 10 before replacing the gas. Further, it is preferable that the $N_2$ gas being supplied has a lower temperature than about 50° C. which is the critical temperature at which the silylation reaction occurs. The gas may of course be replaced without raising the lifter pins 10, so that the spacing from the hot plate 5 is a minimum.

According to the aforementioned process, the following effects can be obtained.

First, by making the wafer W wait while positioned at a predetermined spacing from the hot plate 5 while the silylation reagent vapor is supplied into the treatment chamber 7 until the silylation reagent vapor disperses uniformly therein, it is possible to keep the wafer W at a temperature of 50° C. or less during this waiting, so that the silylation reaction does not occur and the vapor density inside the treatment chamber 7 can become uniform during this waiting time. The silylation reaction has a temperature dependency, in which a high silylation rate is obtained at a higher temperature. The silylation treatment can be performed with the high planer uniformity of the wafer W by maintaining the uniform temperature on the surface of the wafer W in this manner.

Second, by setting the spacing between the hot plate 5 and the wafer W to at least three levels, a stable silylation treatment can be performed without being affected by the transitional temperature change until the temperature of the wafer W rises high enough where the silylation reaction progresses. That is, although the temperature variability of the wafer W is very large when the temperature of the wafer W rises from 23° C. to 80° C., the temperature variability becomes comparatively smaller once it has risen to 50° C., rests, and further rises to about 80° C. to 90° C. so that the silylation treatment with smaller temperature variability becomes possible. Further, the silylation treatment with enough stability can be simply performed by setting the spacing between the hot plate 5 and the wafer W to the plural levels to perform the treatment, even if there are some problems in the structure of the hardware. For example, when the silylation reagent is supplied from the upper portion of the chamber by using a shower or the like, the shape of the blow-out ports of the silylation reagent needs to be extremely precise, but a stable silylation treatment can be performed according to the present invention, regardless of the structure of the blow-out ports.

Third, since the silylation treatment is performed in the sealed up space inside the treatment chamber 7 without reducing the pressure and exhausting, variability in density can be limited to a minimum.

Fourth, the wafer W may be lifted up after the silylation reagent vapor is completely exhausted. It is thus possible to prevent the reaction from unintentionally progressing on the surface of the wafer W.

Fifth, when replacing the silylation reagent vapor by the $N_2$ gas after the completion of the silylation treatment, which is performed along with spacing the wafer W from the hot plate 5 at a predetermined distance, so that the ununiform silylation reaction can be prevented because the gas can be replaced after setting the wafer W at a position with a temperature at which the silylation reaction cannot progress.

Sixth, when the silylation reagent vapor is supplied to obtain uniformity, which is performed after its pressure is once reduced, the amount of gas existing in the treatment chamber 7 decreases so that the uniformity of the density of the silylation reagent improves.

Incidentally, the silylation treatment unit according to the present invention can be applied to other structures than that of this embodiment.

First, a silylation reagent vapor supply system is not limited to the structure shown in FIG. 2. The supply system can take many forms, for example, the structure in which one or plural holes is/are provided in the hot plate 5, through which the silylation reagent vapor is supplied into the surface side of the hot plate 5, and the structure in which a supply port is provided near the exhaust port 17, through which it is supplied toward the treatment chamber 7.

Second, the lifter pin 10 which holds the wafer W at a predetermined spacing from the hot plate 5 can move between added plural levels, besides the three levels of the high level, the medium level and the low level. Further, it can move continuously from the high level to the medium level, or from the medium level to the low level.

Figure 10:
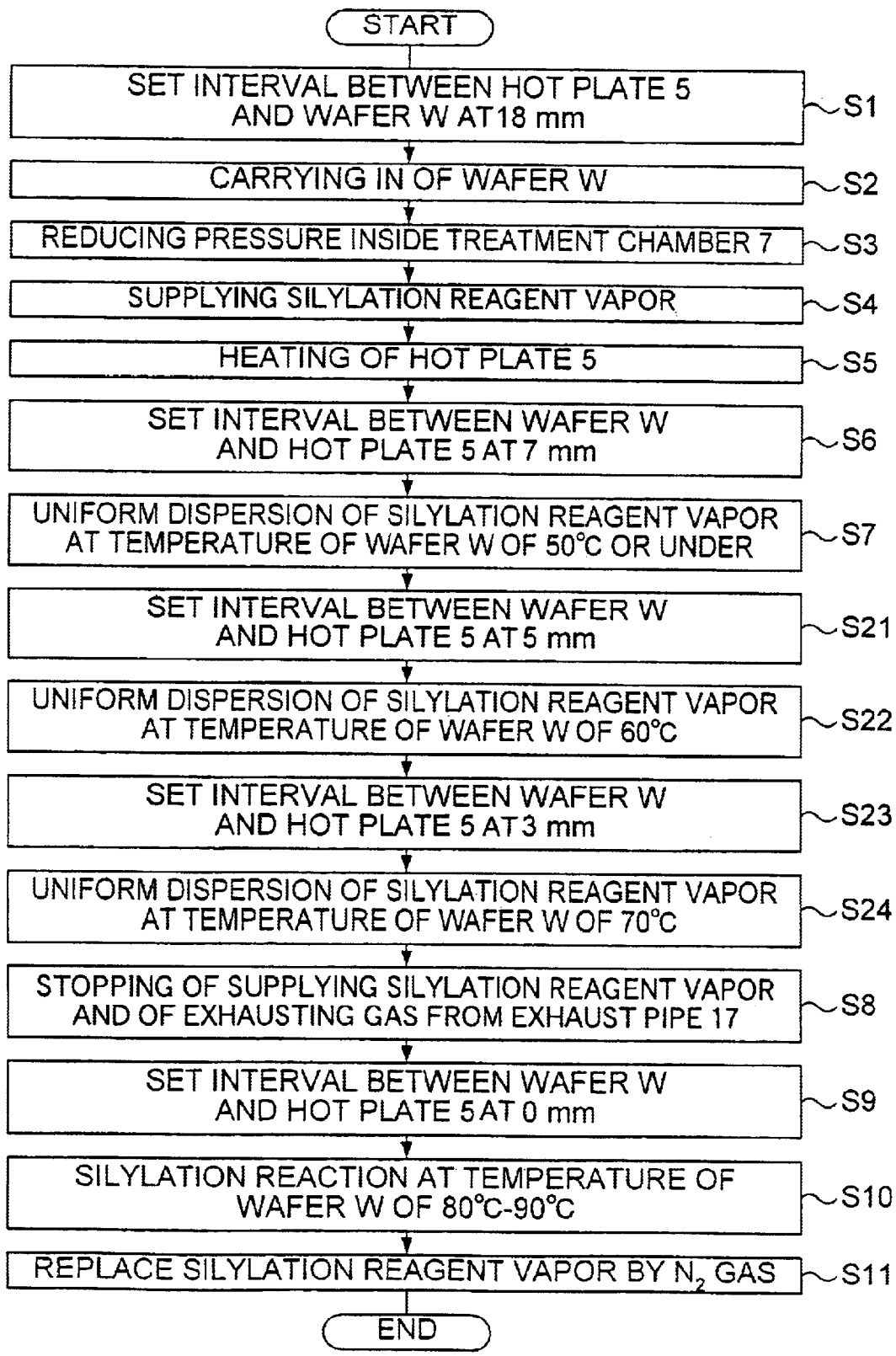
FIG. 10 is a view showing a flow chart of a modification of the silylation treatment.
Figure 11:
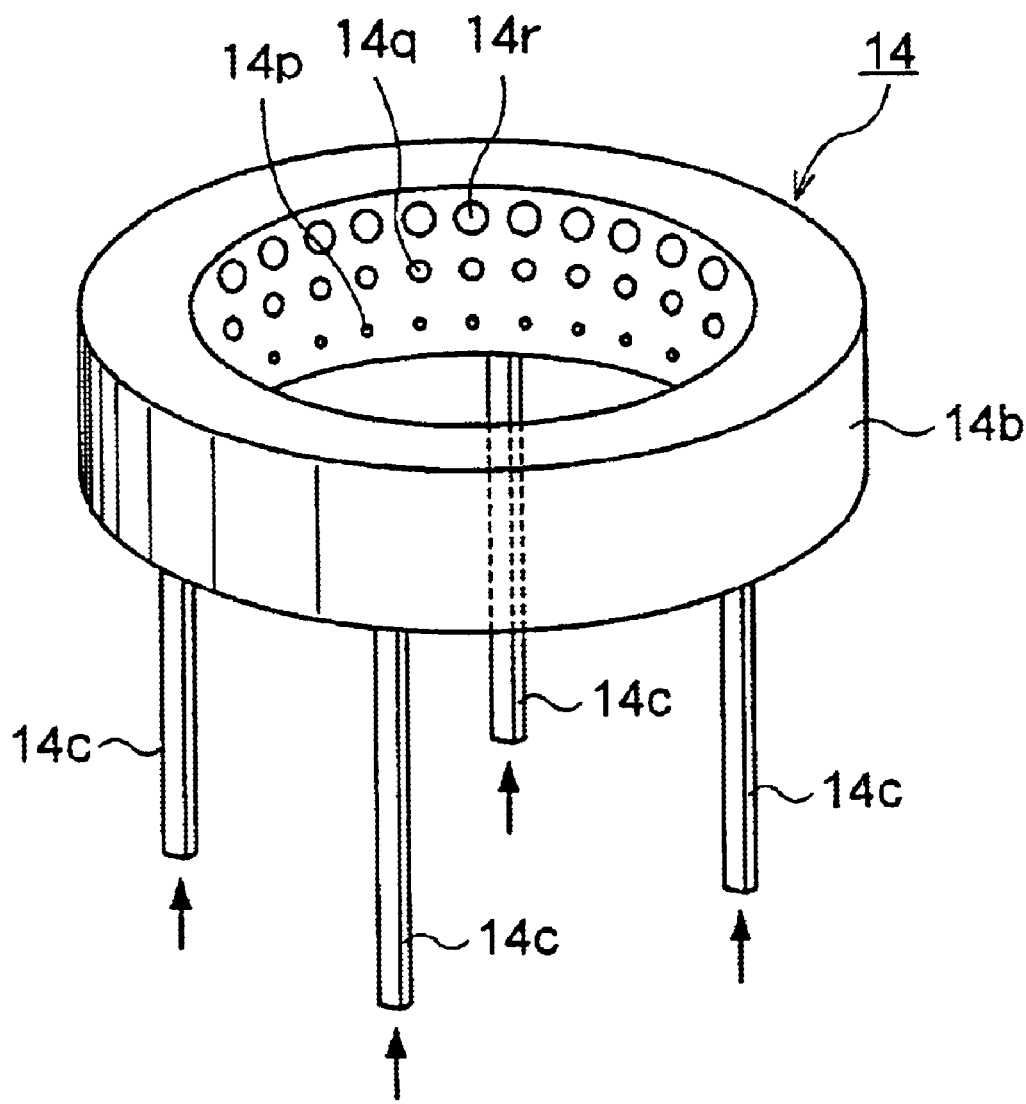
FIG. 11 is a perspective view of another modification of the supply ring.

FIG. 10 shows an embodiment where the hot plate 5 is held at more than four levels. FIG. 10 shows the case where the wafer W moves between five levels. The treatment in the high level where the wafer W is brought in (the spacing between the hot plate 5 and the wafer W is, for example, 18 mm) and the low level where the treatment chamber 7 is sealed to promote the silylation treatment (the spacing between the hot plate 5 and the wafer W is 0 mm) are the same as the case of the three levels (S1 to S7, S8 to S11). In this embodiment, the hot plate 5 is gradually moved downward to occupy plural levels when making the temperature variability inside the treatment chamber 7 uniform.

In this case, the wafer W is held at the position lower than the high level (the spacing between the hot plate 5 and the wafer W is, for example, 7 mm, S6) until the temperature of the wafer W rises to a predetermined temperature (50° C., for example). The wafer W is then moved downward (the spacing between the hot plate 5 and the wafer W is, for example, 5 mm, S21 and S22) when the temperature inside the treatment chamber 7 rises (60° C. for example). The wafer W is further moved downward (the spacing between the hot plate 5 and the wafer W is, for example, 3 mm, S23 and S24) after the temperature further rises (70° C. for example).

Figure 9:
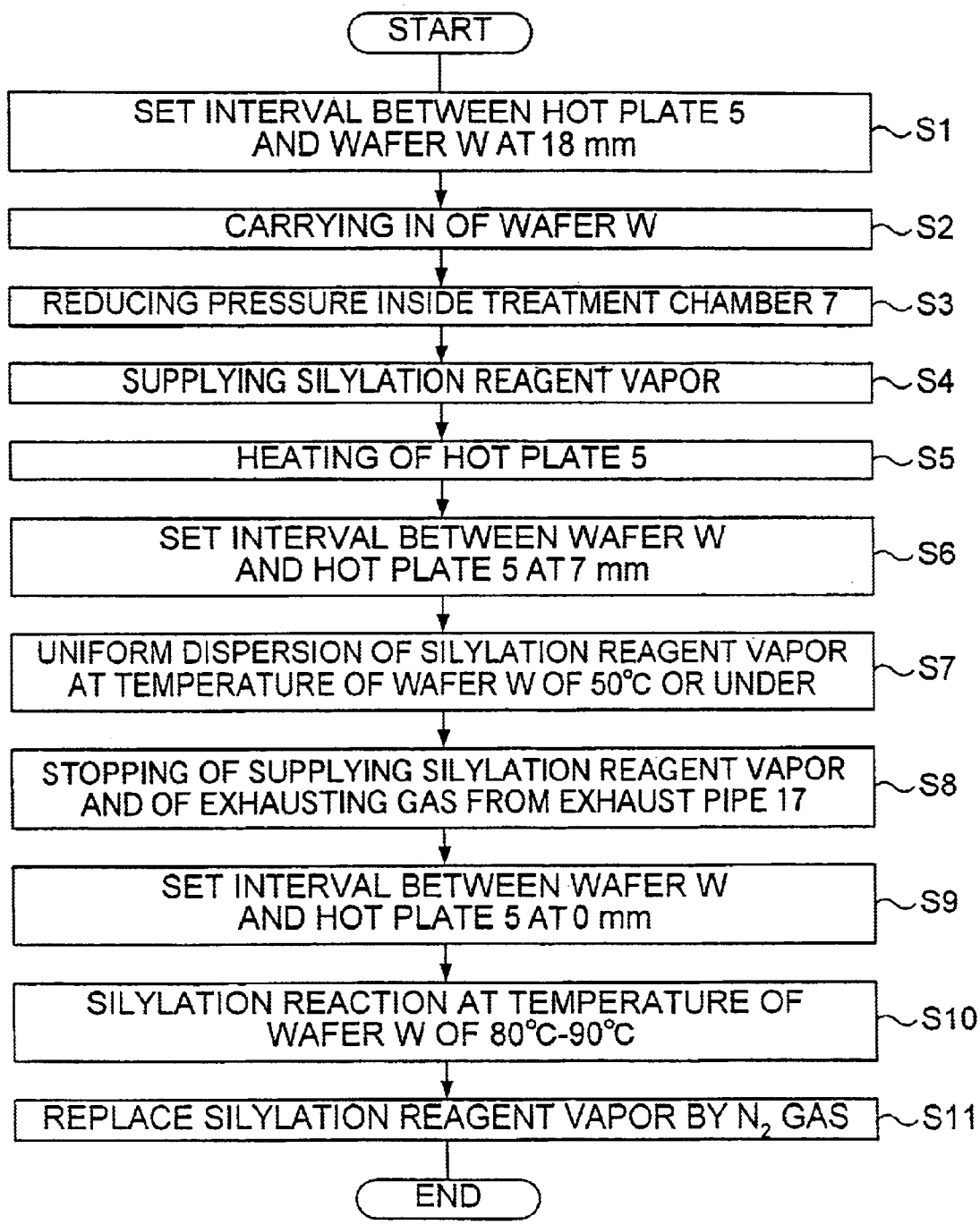
FIG. 9 is a view showing a flow chart of the silylation treatment according to the first embodiment.

The silylation reagent vapor is continuously supplied to the chamber similarly to the case shown in FIG. 9 until the spacing between the hot plate 5 and the wafer W becomes 7 mm to 0 mm. Thus, the wafer W is moved downward in steps of plural levels to reach the final low level, in which the wafer W contacts or is close to the hot plate 5. Accordingly, the wafer W can move closer to the hot plate in steps corresponding to the change of temperature, compared with the case where it is held at only one medium level. Therefore, a silylation treatment with reduced influence of temperature variability can be performed.

Note that the present invention can be applied to the case with four levels or six or more levels although the example of the wafer W which moves vertically in five levels is illustrated in FIG. 10. Further, the interval between the hot plate 5 and the wafer W or the temperature inside the treatment chamber 7 when the wafer W is gradually moving is an example, which is not limited to the above.

Further, the structure of the supply ring 14 can be modified to use as follows. In the supply ring 14 shown in PIG. 11, supply holes 14*p*, 14*q* and 14*r* are formed in the inner circumferential surface of the ring member 14*b*, in which the diameters of the supply holes become larger as their positions become higher. That is, the diameter of the supply hole 14*p* which is in the lowermost positioned is the smallest, the diameter of the supply hole 14*q* which is positioned above supply hole 14*p* is larger than that of the supply hole 14*p*, and the diameter of the supply hole 14*r* which is at the uppermost position is the largest. Thus, by setting the diameters of the supply holes which are vertically arrayed in the inner circumferential surface of the ring member 14*b* to become larger as the holes are positioned higher, an increased volume of vapor can be supplied to the surface of the wafer W to be subjected to the silylation treatment so as to perform the treatment more effectively.

Figure 12:
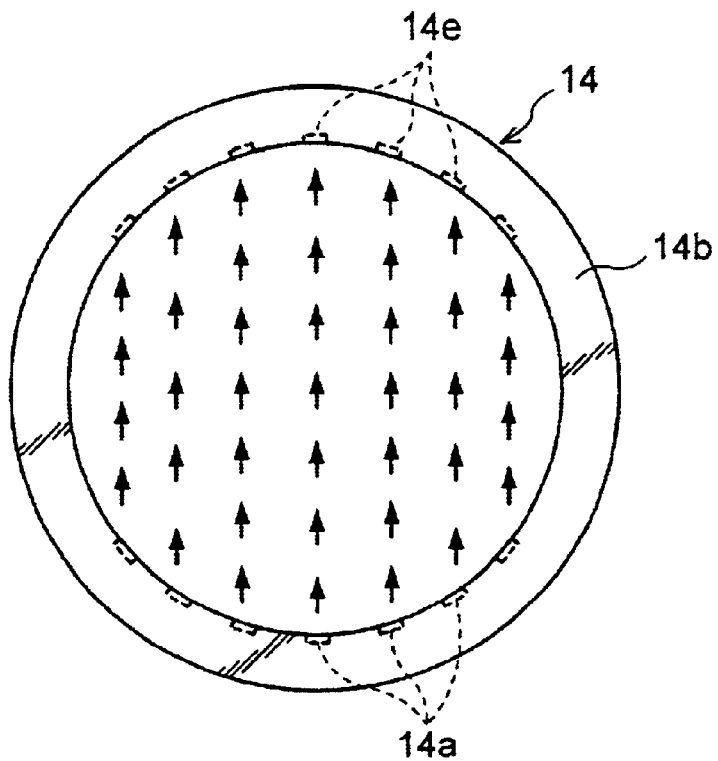
FIG. 12 is a plane view of still another modification of the supply ring.
Figure 13:
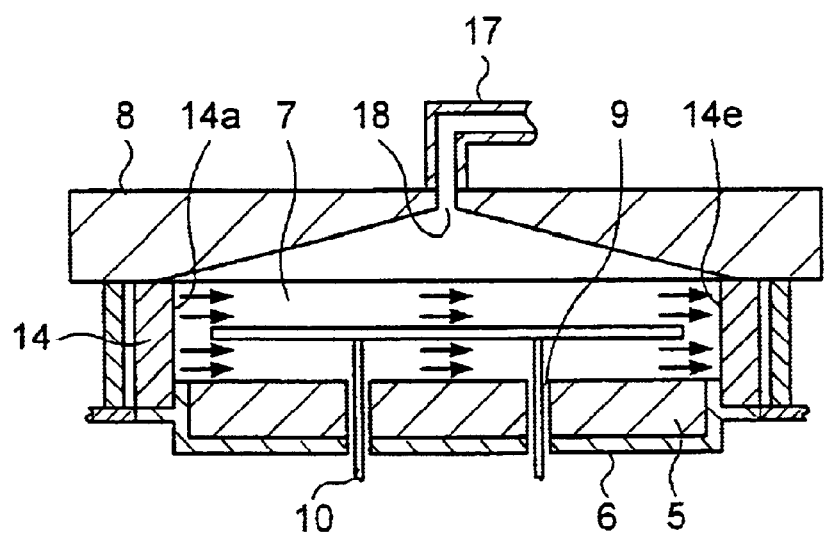
FIG. 13 is an explanatory view of a side section showing the airflow when the supply ring in FIG. 12 is used.

Furthermore, in the supply ring 14 shown in FIG. 12, a plurality of the supply holes 14*a* are formed in half of the inner circumferential surface of a ring member 14*b*, and a plurality of exhaust holes 14*e* are formed opposite to the supply holes 14*a* in the remaining half of the inner circumferential surface. Thus, when the supply hole 14*a* and the exhaust hole 14*e* are disposed opposite to each other, the vapor supplied from the supply hole 14*a* is exhausted, from the opposing exhaust hole 14*e* by flowing horizontally. Therefore, turbulence does not occur so that the uniformity of the treatment is improved and excellent exhaust efficiency is obtained.

Figure 14:
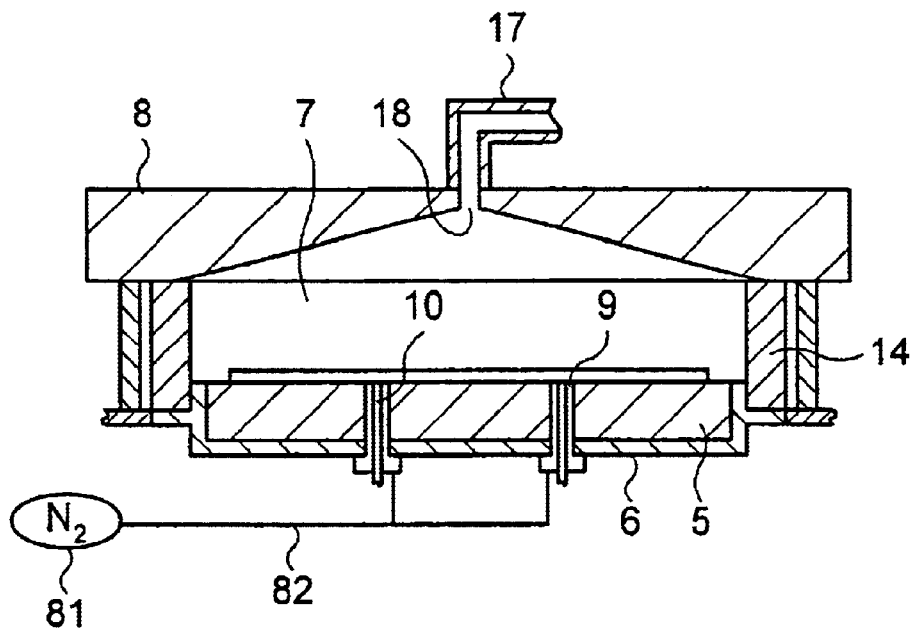
FIG. 14 is an explanatory view of a side section explaining another modification of the silylation treatment unit according to the present invention.

The holes 9 for vertically moving the lifter pins 10 are formed in the hot plate 5. As shown in FIG. 14, the inert gas, for example, the $N_2$ gas may be blown out through the holes 9 to the non-treatment surface of the wafer W, for example, the back surface of the wafer W. In the example shown in FIG. 14, a gas supplying section 81 and a pipeline 82 are provided for supplying the $N_2$ gas to the holes 9.

Figure 15:
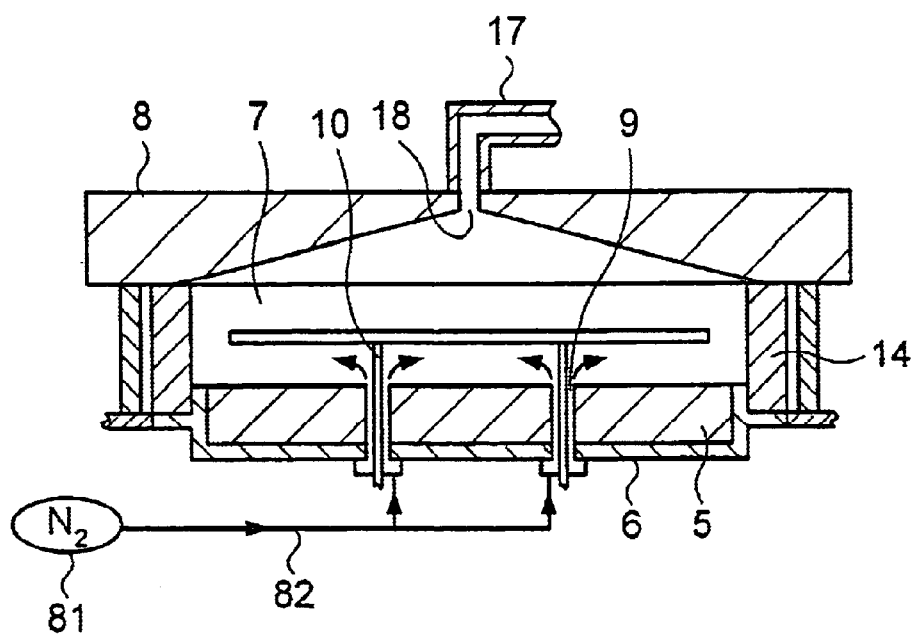
FIG. 15 is an explanatory view of a side section explaining another modification of the silylation treatment unit according to the present invention.

It is preferable to start blowing out the $N_2$ gas to the back surface of the wafer W when the silylation treatment is completed and the vapor including the silylation reagent inside the chamber 7 is purged by the inert gas, or when the vapor including the silylation reagent is purged from inside the chamber 7 by the inert gas and the wafer W starts being lifted by the lifter pins 10 as shown in FIG. 15.

Figure 16:
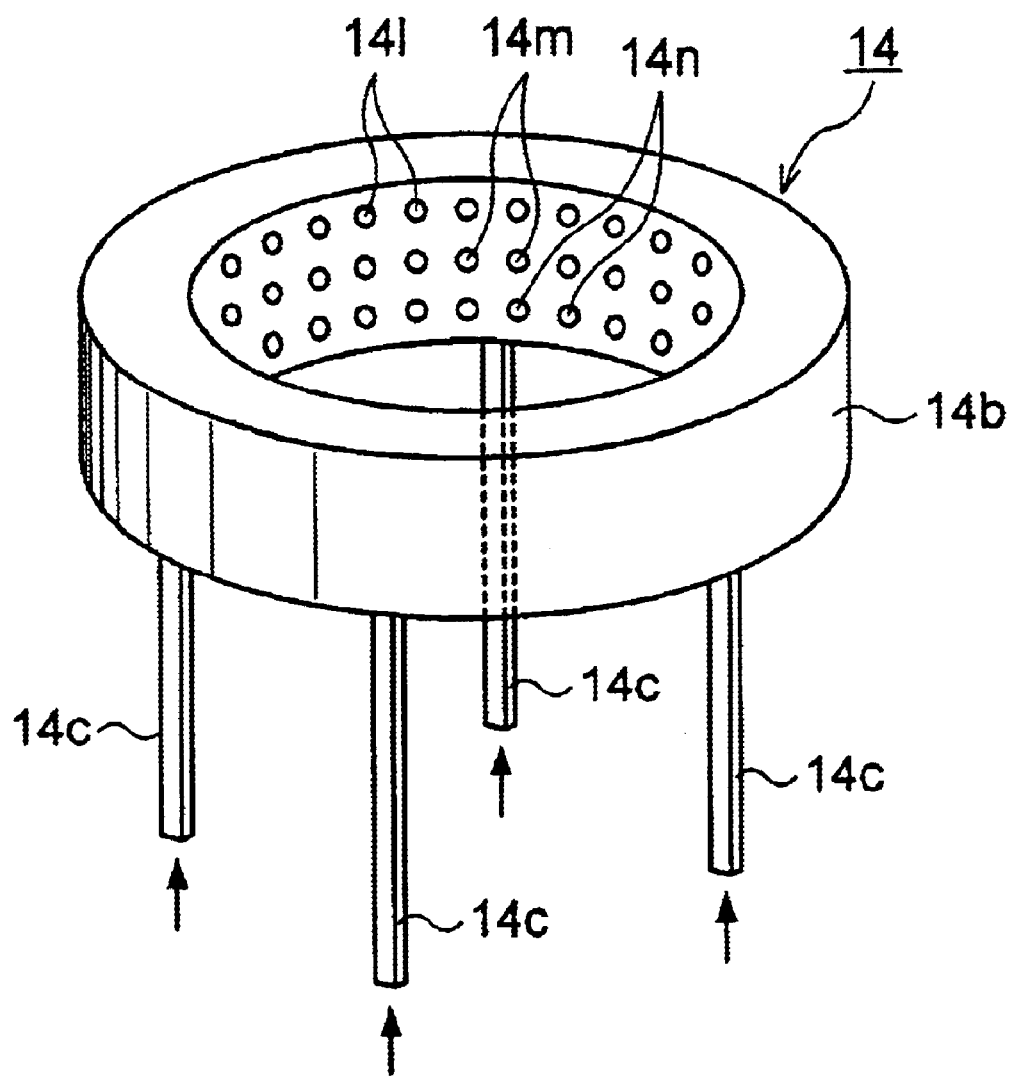
FIG. 16 is a perspective view of another modification of the supply ring.

It is possible to prevent a deposition from adhering to the non-treatment surface of the wafer W by blowing out the gas to the non-treatment surface of the wafer W, for example, to the back surface of the wafer W. The supply ring 14 shown in FIG. 16 is structured so that upper supply holes, for example, 14*l* and 14*m*, supply a processing gas, for example, the vapor including the silylation reagent, to the treatment surface of the wafer W, while the lower supply hole 14*n* blows out the inert gas, for example, the $N_2$ gas, to the non-treatment surface of the wafer W. The supply holes 14*l*, 14*m* and 14*n* are arrayed vertically in the inner circumferential surface of the ring member 14*b*. Thus, it is possible to supply the processing gas, for example, the vapor including the silylation reagent, to the treatment surface of the wafer W, and blow out the inert gas, for example, the $N_2$ gas, to the non-treatment surface of the wafer W. Therefore deposition adhesion to the non-treatment surface of the wafer W can be prevented.

Incidentally, the upper supply holes 14*l* and 14*m* may have structures permitting the processing gas, for example, the vapor including the silylation reagent, and the inert gas to be selectively blown out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for performing a silylation treatment on a surface of a resist film disposed on a substrate, comprising:

a process chamber, a hot plate disposed in the process chamber and configured to heat the substrate from a side reverse to a side on which the resist film is disposed;

a supply system configured to supply a vapor containing a silylation reagent into the process chamber;

an exhaust system configured to exhaust the process chamber;

a substrate holder configured to move the substrate up and down relative to the hot plate in the process chamber; and a driving and controlling section configured to drive and control the substrate holder, and cause the substrate holder to keep the substrate at three or more height positions relative to the hot plate, the three or more height positions including at least an upper position where the substrate is loaded/unloaded to/from the substrate holder, a middle position where the substrate is maintained at rest to be pre-heated by heat from the hot plate at a first temperature below a temperature at which silylation of the surface of the resist film effectively occurs, and a lower position where the substrate is maintained at rest to be heated by heat from the hot plate at a second temperature higher than the first temperature, said second temperature being high enough to cause effective silylation of the surface of the resist film to proceed, wherein the supply system is configured to supply the vapor horizontally and comprises a supply ring disposed to surround the substrate, and supply holes for supplying the vapor are formed in an inner surface of the supply ring and the supply holes further comprise an upper hole and a lower hole arrayed in a vertical direction, and the upper hole has a diameter larger than that of the lower hole.

2. The apparatus according to claim 1, wherein the substrate holder comprises lifter pins penetrating through holes formed in the hot plate, and the lifter pins are configured to support the substrate on top ends thereof.

3. The apparatus according to claim 2, further comprising an inactive gas supply section configured to supply an inactive gas between the hot plate and the substrate through the holes formed in the hot plate through which the lifter pins penetrate.

4. The apparatus according to claim 1, wherein the substrate is in contact with the hot plate at the lower position.

5. The apparatus according to claim 1, wherein the supply holes comprise holes arrayed in an angular direction over the inner surface of the supply ring.

6. The apparatus according to claim 5, wherein the exhaust system comprises an exhaust port formed at a center of a ceiling of the process chamber.

7. The apparatus according to claim 1, wherein the supply holes are formed in half of the inner surface of the supply ring in an angular direction, and the exhaust system comprises exhaust holes formed in the remaining half of the inner surface of the supply ring to face the supply holes.

8. An apparatus for performing a silylation treatment on a surface of a resist film disposed on a substrate, comprising:
   a process chamber;
   a hot plate disposed in the process chamber and configured to heat the substrate from a side reverse to a side on which the resist film is disposed;
   a supply system configured to supply a vapor containing a silylation reagent into the process chamber;
   an exhaust system configured to exhaust the process chamber;
   a substrate holder configured to move the substrate up and down relative to the hot plate in the process chamber, and
   a driving and controlling section configured to drive and control the substrate holder,
   wherein the driving and controlling section comprises,
      means for causing the substrate holder to maintain the substrate at an upper position having a first distance between the substrate and the hot plate, the substrate being loaded/unloaded to/from the substrate holder at the upper position,
      means for causing the substrate holder maintain the substrate at a middle position having a second distance smaller than the first distance between the substrate and the hot plate, the substrate being heated by heat from the hot plate at a first temperature below the temperature at which silylation of the surface of the resist film can effectively proceed while stationary at the middle position, and
      means for causing the substrate holder to keep the substrate at a lower position having a third distance smaller than the second distance between the substrate and the hot plate, the substrate being heated by heat from the hot plate at a second temperature at least as high as the temperature at which silylation of the surface of the resist film can effectively proceed while stationary at the lower position, wherein
   the supply system is configured to supply the vapor horizontally and comprises a supply ring disposed to surround the substrate, and supply holes for supplying the vapor are formed in an inner surface of the supply ring and the supply holes further comprise an upper hole and a lower hole arrayed in a vertical direction, and the upper hole has a diameter larger than that of the lower hole.

9. The apparatus according to claim 8, wherein the substrate holder comprises lifter pins penetrating through holes formed in the hot plate, and the lifter pins are configured to support the substrate on top ends thereof.

10. The apparatus according to claim 9, further comprising an inactive gas supply section configured to supply an inactive gas between the hot plate and the substrate through the holes formed in the hot plate through which the lifter pins penetrate.

11. The apparatus according to claim 8, wherein the substrate is in contact with the hot plate at the lower position.

12. The apparatus according to claim 8, wherein the supply holes comprise holes arrayed in an angular direction over the inner surface of the supply ring.

13. The apparatus according to claim 12, wherein the exhaust system comprises an exhaust port formed at a center of a ceiling of the process chamber.

14. The apparatus according to claim 8, wherein the supply holes are formed in half of the inner surface of the supply ring in an angular direction, and the exhaust system comprises exhaust holes formed in the remaining half of the inner surface of the supply ring to face the supply holes.

* * * * *